United States Patent [19]

Vinal

[11] Patent Number: 5,222,039
[45] Date of Patent: * Jun. 22, 1993

[54] STATIC RANDOM ACCESS MEMORY (SRAM) INCLUDING FERMI-THRESHOLD FIELD EFFECT TRANSISTORS

[75] Inventor: Albert W. Vinal, Cary, N.C.

[73] Assignee: Thunderbird Technologies, Inc., Research Triangle Park, N.C.

[*] Notice: The portion of the term of this patent subsequent to Feb. 5, 2008 has been disclaimed.

[21] Appl. No.: 619,101

[22] Filed: Nov. 28, 1990

[51] Int. Cl.$^5$ .............................................. G11C 11/00
[52] U.S. Cl. .................................. 365/156; 365/154; 257/403
[58] Field of Search ................. 365/156, 154; 357/23.3

[56] References Cited

U.S. PATENT DOCUMENTS

| | | |
|---|---|---|
| Re. 32,993 | 7/1989 | Anami et al. |
| 4,733,112 | 3/1988 | Yamaguchi . |
| 4,739,497 | 4/1988 | Itoh et al. |
| 4,779,226 | 10/1988 | Haraszti . |
| 4,779,230 | 10/1988 | McLaughlin et al. |
| 4,825,413 | 4/1989 | Tran . |
| 4,831,287 | 5/1989 | Golab . |
| 4,833,648 | 5/1989 | Scharrer et al. |
| 4,839,862 | 6/1989 | Shiba et al. |
| 4,843,264 | 6/1989 | Galbraith . |
| 4,845,672 | 4/1989 | Watanabe et al. |
| 4,855,957 | 8/1989 | Nogami . |
| 4,858,189 | 8/1989 | Ogiue et al. |
| 4,858,191 | 8/1989 | Higuchi et al. |
| 4,862,421 | 8/1989 | Tran . |
| 4,866,674 | 9/1989 | Tran . |
| 4,873,665 | 10/1989 | Jiang et al. |
| 4,876,669 | 10/1989 | Yamamoto et al. |
| 4,881,203 | 11/1989 | Watanabe et al. |
| 4,888,737 | 12/1989 | Sato . |
| 4,890,141 | 12/1989 | Tang et al. |
| 4,890,144 | 12/1989 | Teng et al. |
| 4,893,278 | 1/1990 | Ito . |
| 4,901,279 | 2/1990 | Plass . |
| 4,901,284 | 2/1990 | Ochii et al. |
| 4,907,203 | 3/1990 | Wada et al. |
| 4,914,634 | 4/1990 | Akrout et al. |
| 4,990,974 | 2/1991 | Vinal .................. 357/23.3 |

FOREIGN PATENT DOCUMENTS 0365733 2/1990 European Pat. Off. .
WO90/10309 9/1990 PCT Int'l Appl. .

OTHER PUBLICATIONS

International Search Report, Patent Cooperation Treaty, International Appln. No. PCT/US 91/08550, Feb. 17, 1992.

Primary Examiner—Eugene R. LaRoche
Assistant Examiner—Son Dinh
Attorney, Agent, or Firm—Bell, Seltzer, Park & Gibson

[57] ABSTRACT

A static random access memory (SRAM) cell uses a pair of conventional cross-coupled MOSFET devices including an inversion layer, and a pair of inversion-free Fermi threshold FET devices, of the same conductivity type as the cross-coupled transistor pair, for resistive loads. The Fermi-FETs provide a high valued resistor, the value of which is independent of current variations and which is easily fabricated without the need to control polycrystalline silicon grain size. The Fermi-FETs may also provide temperature compensation of the SRAM cell so that it is operable over a wide range of temperature. Fermi-FETs may also be used for the pass transistors of the SRAM cell with the Fermi-FET's low gate capacitance minimizing the loading of the word line. A high speed, dense SRAM cell is provided. The Fermi-FET may also be used in other applications which require low input capacitance, high value constant resistance and temperature compensation.

17 Claims, 8 Drawing Sheets

STATIC RANDOM ACCESS MEMORY (SRAM) INCLUDING FERMI-THRESHOLD FIELD EFFECT TRANSISTORS

FIELD OF THE INVENTION

This invention relates to semiconductor memories and more particularly to field effect transistor (FET) static random access memories (SRAM).

BACKGROUND OF THE INVENTION

Static random access memories (SRAM) are widely used in digital systems to provide a high speed memory function in digital computers and other applications. In the current state of the art, single chip SRAMs typically include from eight thousand memory cells to up to half a million memory cells. Typical access times are on the order of 10 nanoseconds or more, with memory cycle times approximately twice this value.

In the present state of the SRAM art there is a continued need to increase the density of SRAM devices by reducing the size of the individual memory cells. However, a decrease in cell size must not occur at the expense of device operating speed or device reliability. In an SRAM, reliability includes a number of factors. One factor is the yield of SRAM devices in a given manufacturing process. Another factor is the ability to accurately store and recall data. Moreover, SRAM designs must be able to operate at high speeds and with data integrity over wide temperature ranges which are typically experienced by integrated circuit chips during their operation.

A typical SRAM design includes a pair of cross-coupled field effect transistors (FET) of first conductivity type for storing therein a binary "0" or "1". The cross-coupled pair of field effect transistors is typically a pair of N-channel FETs with their sources connected to ground potential, and the drain of the first transistor connected to the gate of the second transistor and the gate of the first transistor connected to the drain of the second transistor. A resistive load is also provided for each transistor in the cross-coupled pair, with each resistive load being serially coupled between a power supply voltage ($V_{DD}$) and the drain of the respective cross-coupled transistor pair. Typically, a pair of "pass" transistors are also provided to facilitate reading and writing of data. A pass transistor is typically coupled to each drain of the cross-coupled transistor pair, with a word line being coupled to the gate transistor and a pair of bit lines connected to a respective one of the pass transistors.

The need to provide resistive loads for the cross-coupled transistor pair has heretofore limited SRAM device density and speed. The load resistors have also increased the standby power consumed by the device or the manufacturing reliability or repeatability. For example, in a well known SRAM design, a pair of N-channel cross-coupled FETs are connected to a pair of P-channel FET load resistors to eliminate standby power. Unfortunately, in order to fabricate P-channel FETs, a separate N-well diffusion is required in the integrated circuit substrate into which the P-type drain and source diffusions are placed. This N-well also must have a power supply voltage contact in addition to the ground contact needed for the substrate. These requirements both consume chip real estate and ultimately limit the density and speed of the SRAM.

The art has also attempted to replace the P-channel load transistors with load resistors. However, the resistance of these load resistors must be very large (for example, greater than 100 mΩ) to prevent excessive standby power from being dissipated by the load resistors. Accordingly, polycrystalline silicon ("polysilicon"), which is slightly doped above its intrinsic value, has been used to achieve the desired resistive value for the load resistors. Unfortunately, the grain size of the polysilicon must be well controlled in order to achieve the desired result. If not well controlled, the intrinsic carrier concentration in the polysilicon will vary widely from the bulk silicon single crystal value, thereby introducing wide manufacturing tolerances and preventing reliable, repeatable fabrication of the SRAM.

Other prior art techniques have used depletion mode, N-channel transistors for load resistors. Unfortunately, the use of N-channel depletion mode transistors leads to a yield problem in attempting to control the slightly conductive state of the channel.

SUMMARY OF THE INVENTION

It is therefore an object of the present invention to provide an improved static random access memory (SRAM) cell.

It is another object of the invention to provide a high density, high speed SRAM cell.

It is yet another object of the invention to provide a high density, high speed SRAM cell which reliably and repeatedly stores and recalls data over wide temperature ranges.

It is still another object of the invention to provide a high density, high speed, reliable, SRAM cell which is simple to manufacture.

These and other objects of the present invention are provided by using a Fermi threshold field effect transistor (Fermi-FET), of the same conductivity type as the cross-coupled transistor pair, for the resistive loads in an SRAM. The Fermi-FET is described in copending application Ser. No. 07/318,153 and copending application Ser. No. 07/370,398 now U.S. Pat. Nos. 4,990,974 and 4,984,043, respectively both of which were filed by the present inventor, Albert W. Vinal and which are assigned to the assignee of the present invention. The disclosures of both of these applications are hereby incorporated herein by reference. As described in these applications, the Fermi-FET has a threshold voltage which is twice the Fermi potential of the semiconductor material, which causes the dependence of the threshold voltage on oxide thickness, channel length, drain voltage and substrate doping to be substantially eliminated. Stated another way, by providing a threshold voltage equal to twice the Fermi potential, inversion is prevented, leading to a high speed device substantially independent of device dimensions.

It has now been found that the Fermi-FET exhibits another characteristic which is extremely useful in SRAM design. In the Fermi-FET there is substantially no subthreshold current variation with gate voltage below threshold because the transistor is free of an inversion layer. This unique property of the Fermi-FET allows it to be structured as a source follower to achieve a constant load resistance value within a desired range of resistance. A high valued resistor with well controlled resistance properties may thereby be obtained, with the resistance remaining substantially constant within the subthreshold operating range of the device. The desired resistance value may be set by the physical dimensions of the Fermi-FET load transistor and by setting the intrinsic carrier concentration of the single crystal semiconductor in which the Fermi FET is fabricated. The resistance of polycrystalline silicon does not determine the load resistance, so that grain size control problems are avoided.

According to another aspect of the present invention, it has been found that when conventional FETs which include an inversion layer are used for the cross-coupled transistor pair, and Fermi-FETs which are inversion free are used for the load resistors, automatic compensation for the thermal environment of the cell may be provided. In particular, it has been found that the Fermi FET may be designed to decrease its resistance with increasing temperature to thereby compensate for the decrease in resistance with increased temperature in a conventional FET. Accordingly, temperature compensation may be provided.

According to yet another aspect of the present invention, the pass transistors of the SRAM cell are also Fermi-FETs. It has been found that the Fermi-FET exhibits a gate capacitance which is typically one half to one fourth the gate capacitance of a similarly structured conventional FET. Accordingly, capacitive loading of the word lines is substantially reduced.

The SRAM cell of the present invention may be fabricated using FET devices of a single conductivity type, thereby eliminating the need for tubs and thereby decreasing the size of the cell. Moreover, the Fermi-FET functions as a high value load resistor with the resistance value being easy to set and well controlled, thus simplifying manufacture of the device. The small device size coupled with the low-input capacitance provides high speed device operation. A high density, high speed SRAM is thereby provided.

According to the invention, three newly discovered properties of the Fermi-FET may be utilized in the design of the SRAM cell. They are (1) the low gate capacitance of the Fermi-FET compared to a conventional FET which provides low input capacitance; (2) the constant subthreshold current value of the Fermi-FET coupled to a conventional FET which provides a well controlled resistors; and (3) the decreasing resistance of the Fermi-FET resistor with increasing temperature, which provides temperature compensation. These properties may be used in circuits other than SRAM cells. For example, many circuits include inputs which are coupled to the outputs of other devices. In such circuits, the input capacitance must be minimized to reduce the loading effect on the other devices. Accordingly, the Fermi-FET is preferably used as the input device in such circuits. Similarly, many circuits require high valued resistors for biasing or other purposes. The subthreshold current properties of the Fermi-FET make it ideal for use as a high valued resistor, whose value does not depend on tight control of polycrystalline silicon grain size. Finally, temperature compensation is often required so that circuits can operate reliably over wide ranges of temperature. The resistance versus temperature property of the Fermi-FET make it ideal for use for temperature compensation in a circuit.

DESCRIPTION OF A PREFERRED EMBODIMENT

The present invention now will be described more fully hereinafter with reference to the accompanying drawings, in which a preferred embodiment of the invention is shown. This invention may, however, be embodied in many different forms and should not be construed as limited to the embodiment set forth herein; rather, this embodiment is provided so that this disclosure will be thorough and complete, and will fully convey the scope of the invention to those skilled in the art. Like numbers refer to like elements throughout.

CONVENTIONAL SRAM CELLS

Figure 1A:
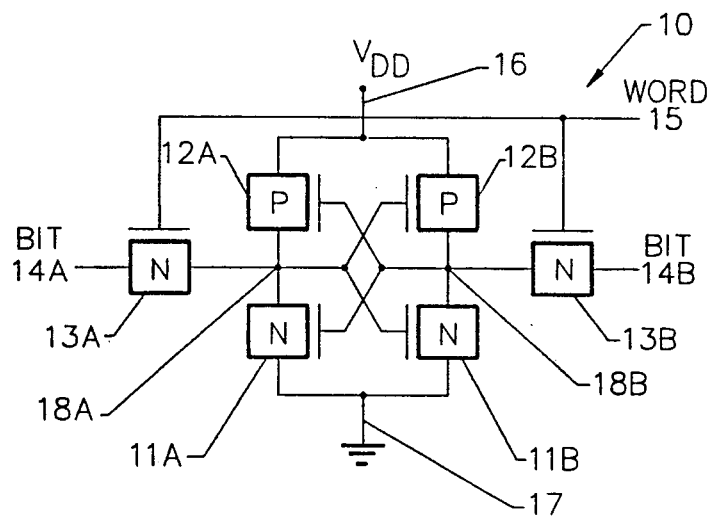
FIGS. 1A-1C illustrate circuit diagrams of conventional FET SRAM cells.

Referring now to FIG. 1, three configurations for conventional SRAM cells are described. As shown in FIG. 1A, SRAM cell 10 includes a pair of cross-coupled N-channel FETs 11A, 11B for storing binary data therein. A pair of P-channel load resistor FETs 12A, 12B are also provided. The load resistors 12A, 12B are connected to the respective cross-coupled transistors 11A, 11B at nodes 18A and 18B. The load transistor 12 and cross-coupled transistor 11 are serially connected across a pair of reference potentials 16 and 17. As shown, reference potential 16 is typically the power supply Voltage $V_{DD}$ and potential 17 is typically ground. A pair of pass transistors 13A, 13B are connected to nodes 18A and 18B respectively. A pair of bit lines 14A, 14B are connected to the pass transistors 13, and a word line 15 is connected to the gate of the pass transistors 13. It will be understood by those having skill in the art that transistors 11, 12 and 13 are conventional FETs, and are typically metal oxide semiconductor FETs (MOSFET), also referred to as metal insulator semiconductor FETs (MISFET).

In operation, selection of the word line 15 enables the pass transistors 13 to allow sensing of data on bit lines 14 or reading of the data via bit line 14. It will be understood by those having skill in the art that because load resistors 12 are P-channel devices they require an N-well diffusion in the substrate into which the P-type source and drain diffusions are placed. This N-well must also have a supply voltage contact in addition to the ground contact needed for the substrate. Both of these requirements consume chip real estate that limits the packing density of the cell.

Figure 1B:
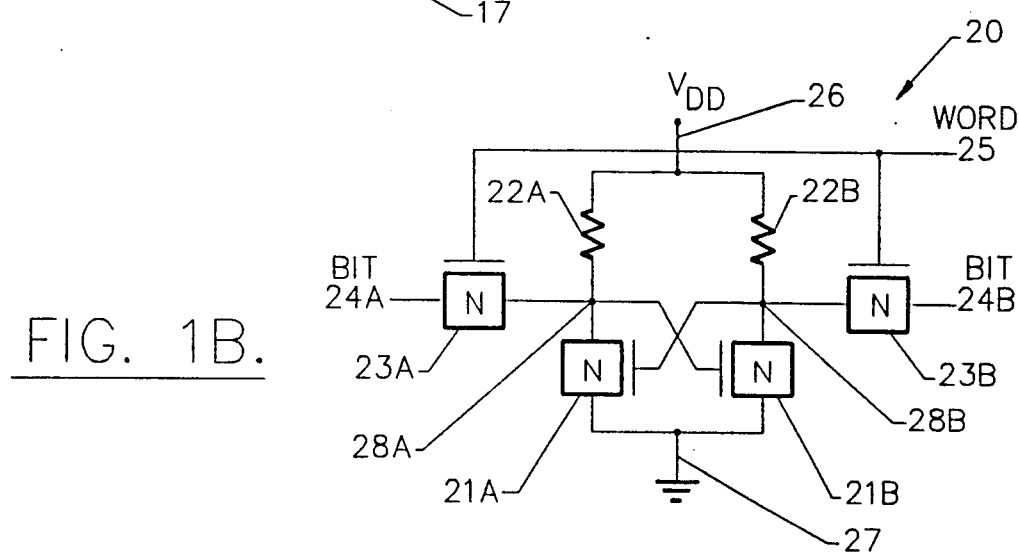

FIG. 1B illustrates a second embodiment of a conventional SRAM cell 20. In FIG. 1B a pair of discrete load resistors 22A, 22B are connected to cross-coupled transistor pair 21A, 21B at nodes 28A, 28B. Transistors 21 and resistors 22 are connected between $V_{DD}$ (26) and ground (27). Pass transistors 23A, 23B are connected to word line 25 and bit lines 24. It will be understood by those having skill in the art that the resistance of the load resistors 22 must be 100 mΩ or more, in order to prevent excessive standby power dissipation in the load resistors 22. Heretofore, polycrystalline silicon, slightly doped above the intrinsic value has been used to fabricate the load resistors. However, in order to obtain a reliably set load resistance, the grain size of the polycrystalline silicon must be very carefully controlled resulting in high manufacturing cost and decreased yield.

Figure 1C:
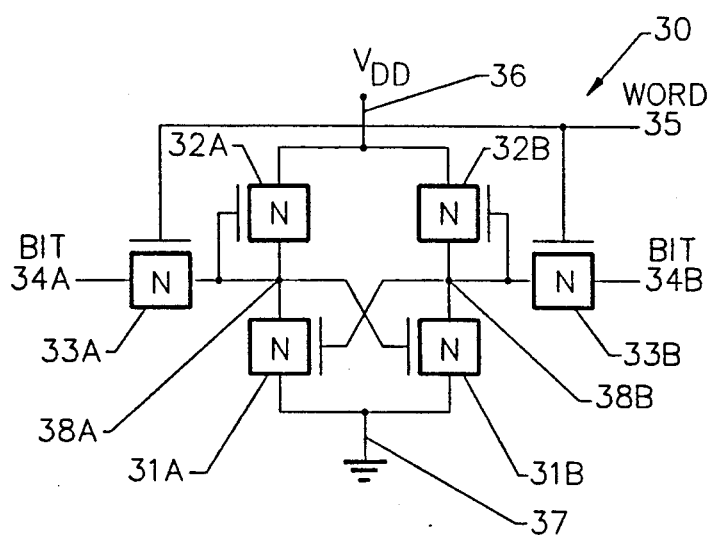
Figure 3:
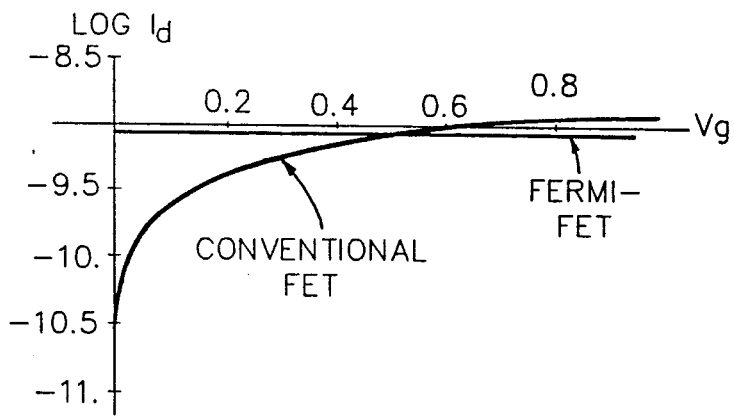
FIG. 3 is a graphical illustration of the subthreshold drain current versus gate voltage characteristics of the FET devices of FIG. 2.

FIG. 1C illustrates a third embodiment of a conventional SRAM cell. SRAM cell 30 includes a pair of cross-coupled transistors 31 with enhancement mode N-channel transistors 32A, 32B for load resistors. Pass transistors 33A, 33B are coupled to nodes 38A, 38B and to bit lines 34A, 34B and word line 35 as already described. This configuration allows all N-channel devices to be fabricated. However, because the loads 32A, 32B devices are enhancement devices, a number of problems are presented. As shown in the Figure, the gates of these load transistors are connected to their respective sources. The subthreshold current property of these enhancement transistors is illustrated in FIG. 3 for Vg equal zero. The resulting resistance value for these load resistors is so high that efficient pass transistor coupling to the bit lines during reading of data severely comprises reliable data retrieval from such memory cells.

SRAM OF THE PRESENT INVENTION

Figure 2:
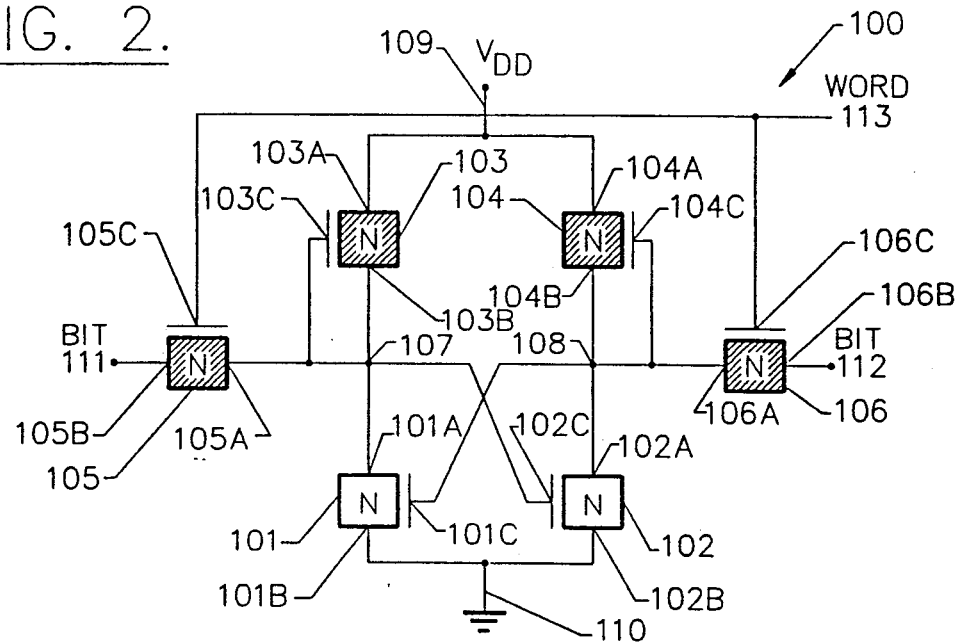
FIG. 2 illustrates a circuit diagram of an SRAM according to the present invention.

Referring now to FIG. 2, an SRAM cell using Fermi FETs according to the present invention will now be described. As shown in FIG. 2, all transistors are of the same conductivity type so that tubs or wells are not required. It will be understood by those having skill in the art that P-channel SRAM cells may also be produced.

As shown in FIG. 2, SRAM cell 100 includes a pair of cross-coupled transistors 101, 102 and a pair of Fermi-FET transistors 103, 104 to supply the resistive load. The Fermi-FET transistors are connected at nodes 107 and 108. A pair of pass transistors 105, 106 which are preferably Fermi-FET transistors for the reasons described below, are connected to bit lines 111 and 112 and word line 113. The load transistors 103 and 104 and the cross-coupled transistors 101 and 102 are serially connected between first reference potential 109 (for example power supply voltage $V_{DD}$) and second potential 110 (for example ground potential). It will be understood by those having skill in the art that cross-coupled transistors 101, 102 are preferably conventional MOS devices which include an inversion layer.

The use of the Fermi-FET load resistors 103, 104 provides a number of advantages in the design of an SRAM cell. The use of Fermi-FET pass transistors 105, 106 also provides a number of advantages in the design of an SRAM cell. These advantages are as follows:

(1) Constant Value Resistor: The Fermi-FET acts as a constant value load resistor because it does not exhibit a subthreshold current variation since channel inversion does not proceed conduction in the Fermi-FET. Accordingly, the Fermi-FET may be provided in source follower configuration to achieve a constant load resistance of useful value. This contrasts sharply with conventional FET devices which include an inversion layer, in which the resistance varies dramatically with gate voltage below threshold. It will also be understood by those having skill in the art that because the Fermi-FET used in the source follower configuration, with zero potential between source and gate, the Fermi-FET may be fabricated with either P or N-polycrystalline silicon gate contacts.

(2) Temperature Compensation: The Fermi-FET may be fabricated to decrease its resistance with an increase in temperature to thereby compensate for the decrease in resistance of the cross-coupled transistors and thereby provide automatic compensation for the thermal environment of the array.

(3) Controlled Resistance: The resistance of the Fermi-FET may be easily controlled during manufacturing because resistance is not a function of polycrystalline silicon grain size. High valued integrated circuit resistors may thereby be fabricated with increased manufacturing reliability.

(4) Low Gate Capacitance: The gate capacitance of the Fermi-FET is much less than a conventional FET. Accordingly pass transistor loading of the word line is substantially reduced.

(5) High Density SRAM: The Fermi-FET allows a high density SRAM array to be easily fabricated.

Many of the above advantages make the Fermi-FET useful for circuit applications apart from the SRAM cell. The above advantages will now be described in detail.

FERMI FET AS A CONSTANT VALUE, WELL CONTROLLED RESISTOR

Prior to describing the use of a Fermi-FET as a constant value load resistor, the need for high value for the load resistors of an SRAM cell will be described. As will be understood by those having skill in the art, each SRAM cell dissipates power of $V_{DD}^2/R$ so that an array of n SRAM cells dissipates n times the power of one cell. For example if there are one million cells and R is 100 mΩ and $V_{DD}$ is 5 volts, the array standby power is 250 milliwatts. This standby power is unacceptably high. Accordingly, the load resistors should be 400 mΩ or more in resistive value so that a 1 megabit SRAM array will dissipate 60 milliwatts which is acceptable.

There is also an upper bound to the resistance value of the load resistors because the higher the resistance, the less tolerant is the SRAM cell's capability to reliably deliver its data contents to the bit lines given an imbalance in the capacitive load on the bit lines. This is because the higher the resistive value the greater the resistive voltage drop. The voltage drop across the load resistor determines the maximum "up" or "high" level of the node between the resistor and the cross-coupled transistor pair (node 18 of FIG. 1A, node 28 of FIG. 1B, node 38 of FIG. 1C and nodes 107 and 108 of FIG. 2). In other words, the highest level of this node is determined by the drain current value times the resistance of the load resistance substrated from the supply voltage $V_{DD}$. Accordingly, the cross-coupled transistor pair is not capable of supporting the full value of drain current which is capable of flowing through the pass transistors during a read or write operation, as would be the case if the appropriate input of the ground couple and transistor went to supply voltage $V_{DD}$ rather than $V_{DD}$ minus IcR.

The Fermi-FET is described in copending U.S. Patent applications Ser. No. 07/318,153 and 07/370,398, now U.S. Pat. Nos. 4,990,974 and 4,984,043, respectively by the present inventor Albert W. Vinal and assigned to the assignee of the present invention, the disclosures of which are expressly incorporated herein by reference. As described therein, the Fermi-FET has a fixed depth for the depleted channel region which is due to the self-depleted Fermi channel implant having a depth $Y_0$. The depth $Y_0$ of the Fermi FET channel is defined as:

$$Y_o = \sqrt{\frac{2e_s \phi_s}{q N_a \alpha(\alpha + 1)}} \tag{1}$$

where $e_s$ is the dielectric constant of the semiconductor material; $\phi_s$ equals twice the Fermi potential of the semiconductor material; q is the electron charge, Na is the substrate doping density; and $\alpha$ is the ratio of Fermi channel impurity implant concentration to substrate impurity concentration.

The drain current expression for the Fermi FET connected as a source follower is:

$$I_d = N_i q \mu_n Z Y_o \frac{V_d}{L_c} \tag{2}$$

where $I_d$ equals the Fermi-FET drain current, $N_i$ is the intrinsic carrier concentration, $\mu_n$ is the electron mobility in an intrinsic environment, Z is the channel width, $Y_0$ is the Fermi channel implant depth defined above, $V_d$ is the drain voltage and $L_c$ is the channel length. Accordingly, the expression for the Fermi load resistance is:

$$R_f = \frac{V_d}{I_d} = \frac{L_c}{N_i q \mu_n Z Y_o} \tag{3}$$

It is apparent from Equation (3) that the resistance of the Fermi-FET, below threshold, is independent of drain voltage or drain current. In other words, below threshold the Fermi-FET presents a constant resistance. The Fermi resistance value can be controlled by several parameters. For example, resistance $R_f$ varies directly with channel length $L_c$ and inversely with intrinsic carrier concentration $N_i$, channel width Z and the depth of the Fermi channel $Y_0$.

One particularly useful technique for setting the value of the Fermi load resistance is by increasing the intrinsic carrier concentration $N_i$ by implanting germanium atoms into the substrate with a depth slightly in excess of the Fermi depth $Y_0$. The bandgap for germanium is lower than silicon thus accounting for the increase in intrinsic carrier concentration $N_i$. The implant concentration of germanium should not exceed the impurity concentration of the silicon substrate. For example, to set the resistance of the Fermi FET to $4.21 \times 10^8$ ohms at room temperature, the following parameters may be set:

$N_i = 1.5e10/cm^3$ $q = 1.6e-19$ Coulombs $\mu_n = 1,100$ cm/sec$^2$ $Z = 3e-4$ cm.

$Y_o = 3e-4$ cm.

$L_c = 1e-4$ cm.

Accordingly, the value of the Fermi-FET resistor can be reproducably controlled to a desired value.

The constant resistance of the Fermi-FET may be sharply contrasted with the variable resistance of a conventional MOSFET which includes an inversion layer. Proceeding from first principles, an expression for subthreshold drain current for a typical MOSFET may be derived as follows:

$$I_d = q(\mu_n + \mu_p) Z \frac{V_d}{L_c} \left[ N_i Y_i + \frac{\mu_p N_i^2}{(\mu_n + \mu_p) N_a} (Y_{max} - Y_i) \right] \tag{4}$$

where $\mu_p$ is the hole mobility is an intrinsic environment; $Y_i$ is the depth of the depletion region in the substrate below the oxide due to the inversion mechanism; and $Y_{max}$ is a maximum depth of the depletion region at the onset of channel formation. Using the divergence theorem and Poisson's equation, the expression for the depth of the depleted substrate region directly below the oxide layer is:

$$Y_i = \frac{e_s}{C_i} \left[ \sqrt{1 + \frac{2 C_i^2}{q N_a e_s} V_g} - 1 \right] \tag{5}$$

Where $C_i = e_i/t_{ox}$, and $t_{ox}$ is the oxide thickness of the gate insulating layer. From Equation (4), the value of the resistance of the typical MOSFET may be derived. It can be seen that the resistance of a conventional MOSFET is dependent upon the depth of the depletion region which varies as a function of the gate voltage Vg of Equation (5).

Referring now to FIG. 3, a plot of Equation (4) is shown for a "conventional FET" having $t_{ox} = 165A$, $N_a = 1e16$, $e_i = 3.45e-13$ F/cm, and $e_s = 1e-12$ F/cm, $C_i = 2e-7 F/cm^2$, and $V_d = 5$ Volts, $(\mu_n + \mu_p) = 1,100$ cm$^2$/v-sec. Also shown on FIG. 3 is a plot of the constant current property of the Fermi-FET for subthreshold voltages. As shown, the Fermi load current and MOS subthreshold drain current are equal when the gate voltage for the MOS device is about 0.5 volts. MOS drain current drops rapidly below the Fermi value for all gate voltages less than 0.5 volts. Accordingly, the Fermi-FET may be used in any FET circuit which requires a high valued load resistor, whose value does not change over a wide range of voltage or current.

FERMI-FET AS A TEMPERATURE COMPENSATING LOAD RESISTOR

An important consideration in the design of an SRAM cell is temperature compensation, because the cell must operate reliably over varying temperature ranges. According to the present invention, the Fermi load resistors 103, 104 decrease in value with rising temperature by the same temperature dependance of subthreshold current in the cross-couple transistor pair 101, 102. Accordingly, nodes 107 and 108 remain at the same steady state voltage regardless of the ambient temperature.

The variation with temperature T originates from variations in the intrinsic carrier concentration $N_i(t)$ for the specific semiconductor material. For silicon, $N_i(t)$ can be described as follows:

$$N_i(T) = N_{sb} \left( \frac{T_{new}}{T_{ref}} \right)^{\frac{3}{2}} \left( E - \frac{q}{k} \left( \left( \frac{E_{gref}}{T_{ref}} \right) - \left( \frac{E_{gnew}}{T_{new}} \right) \right) \right)^{\frac{1}{2}} \quad (6)$$

Where the energy gap Eg is defined in electron volts and for silicon has the following temperature dependance:

$$E_g = 1.16 - \left[ \frac{7.02e^{-4} T}{T + 1108.0} \right] \quad (7)$$

Figure 4:
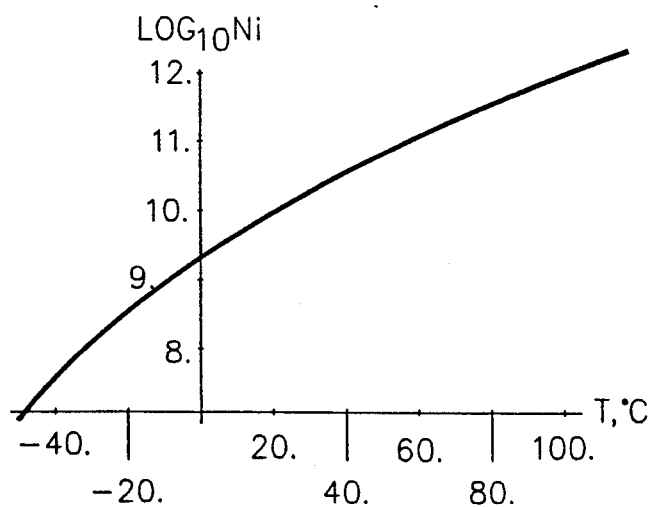
FIG. 4 is a graphical illustration of intrinsic carrier concentration as a function of temperature for the FET devices of FIG. 2.

Referring now to FIG. 4, the intrinsic carrier concentration $N_i$ for silicon of Equation (6) is plotted as a function of temperature T. As shown, for a conventional transistor current rises as the temperature increases. However, for a Fermi-FET the resistance lowers as temperature increases, since Fermi-FET resistance, Equation (3), is inversely proportional to the intrinsic carrier concentration $N_i$. Accordingly, the drain voltage stays the same so that the curves of FIG. 3 continue to intersect at about 0.5 volts over a wide range of temperatures. A temperature compensated SRAM is thereby provided. The Fermi-FET may be used for temperature compensation in other circuits using conventional FETs.

FERMI FET PASS TRANSISTOR FOR REDUCED CAPACITANCE

Referring again to FIG. 2 the pass transistors 105 and 106 are preferably Fermi-FET devices because they exhibit a gate capacitance which, through design, can range from one half to one fourth that of a conventional FET device, thereby providing a substantially lower capacitative load on the word line 113. It will be understood by those having skill in the art that a large number of memory cells 100 is typically coupled to a single word line 113 so that capacitive loading decreases the overall speed of operation. By using a Fermi-FET pass transistor the capacitance is greatly reduced. Loading of the word line is thereby minimized, simplifying the design of the word drivers, and providing a high speed SRAM array.

The gate capacitance of a conventional FET device may be represented by:

$$C_{mos} = \frac{1}{\frac{\delta}{2e_s} + \frac{1}{C_i}} \quad (8)$$

Where $\delta$ is the inversion depth. Typically, the capacitance of an MOS device may be approximated by $C_i$. On the other hand for a Fermi FET the gate capacitance may be given by Equation (9):

$$C_{FERMI} = \frac{1}{\frac{Y_o}{2e_s} + \frac{1}{C_i}} \quad (9)$$

For a typical Fermi FET this may be approximated as $2e_s/Y_0$. For typical values this will be one third the value of a MOS gate capacitance. Accordingly, in any circuit where input capacitance must be minimized, the Fermi-FET is preferably used.

HIGH DENSITY SRAM LAYOUT

Referring now to FIG. 5, the integrated circuit layout of a high density SRAM according to the present invention will be described. It will be understood by those having skill in the art that other layouts are possible. However, the layout described herein illustrates how a high density SRAM array may be fabricated using the SRAM cell of FIG. 2.

Figure 5A:
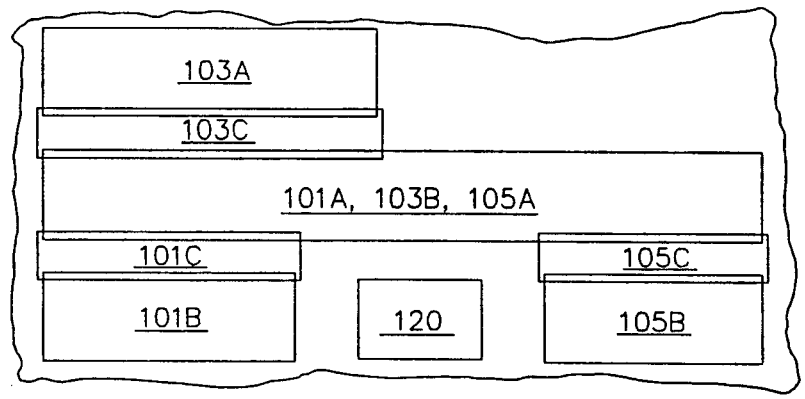
FIGS. 5A-5G illustrate an integrated circuit layout of an array of SRAM cells of FIG. 2.
Figure 5B:
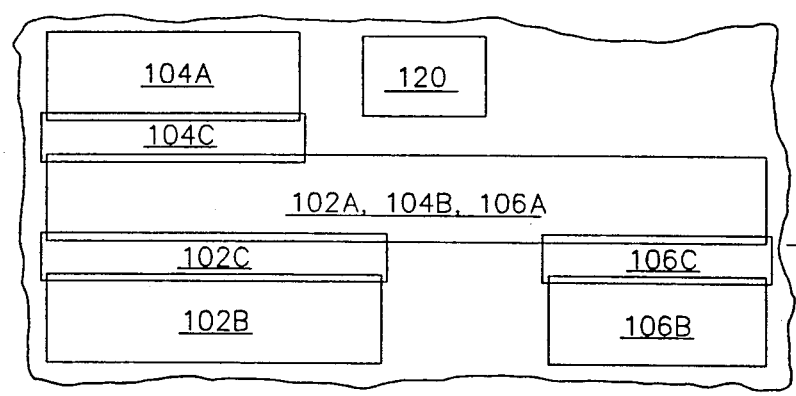

Referring now to FIG. 5A, the layout of Fermi-FET 103, conventional FET 101 and pass transistor 105 on the left half of cell 100 is shown. As shown in FIG. 5A, a common diffusion includes the drain 101A of cross-coupled transistor 101, the source 103B of Fermi load transistor 103 and the source 105A of pass transistor 105. The gate region 103C overlies this common diffusion and the source of Fermi FET 103A. The gate 101C of cross-coupled transistor 101 overlies the common diffusion and the source of Fermi-FET 101B. A substrate contact 120 is also included. Corresponding regions for the right half of the cell of FIG. 2 are shown in FIG. 5B.

Figure 5C:
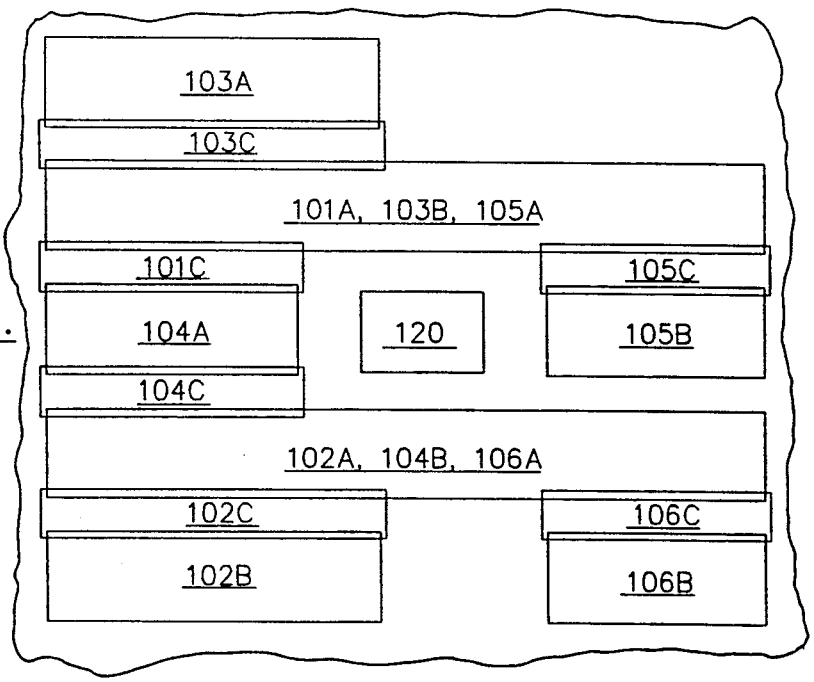
Figure 5D:
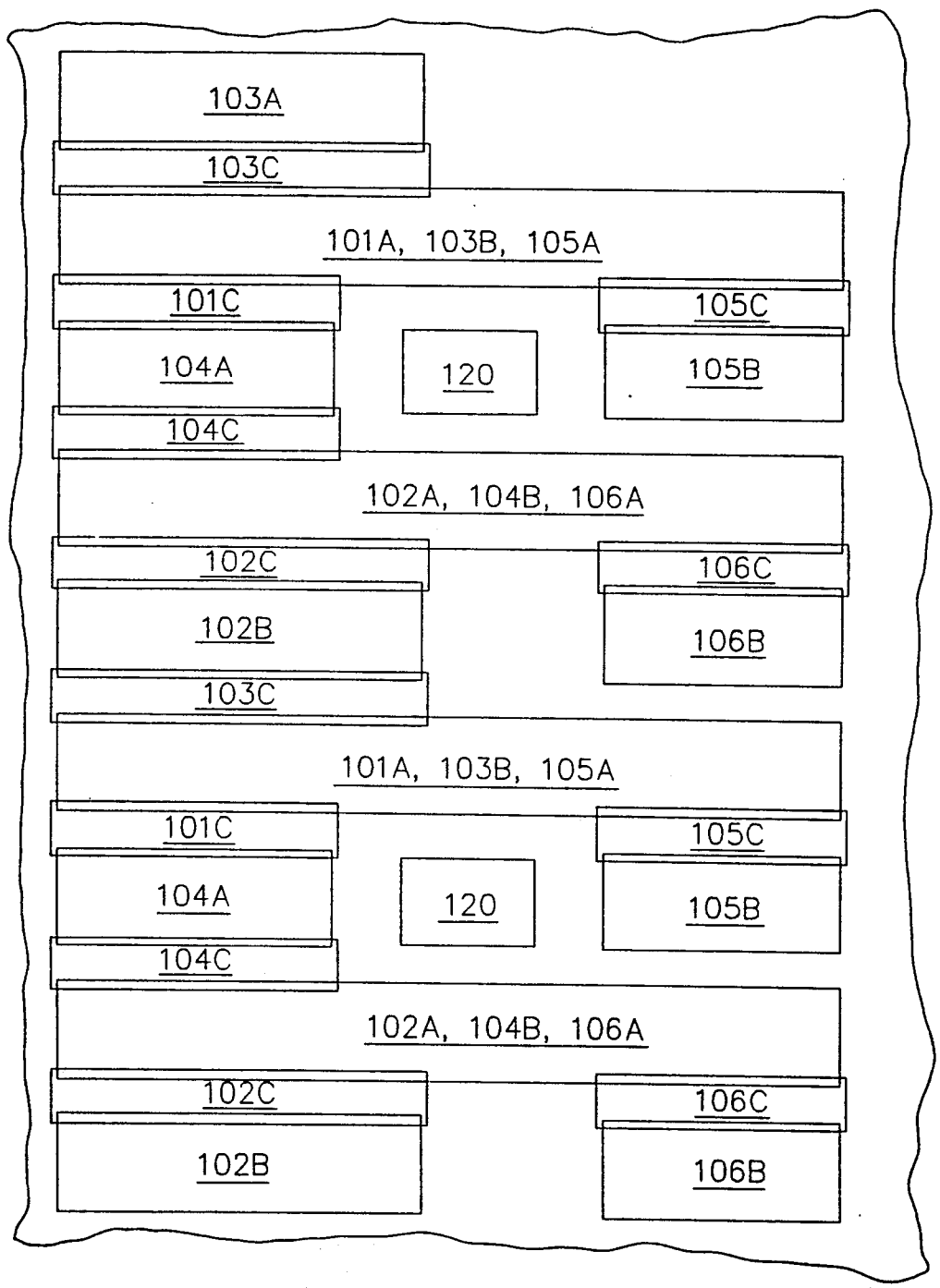
Figure 5E:
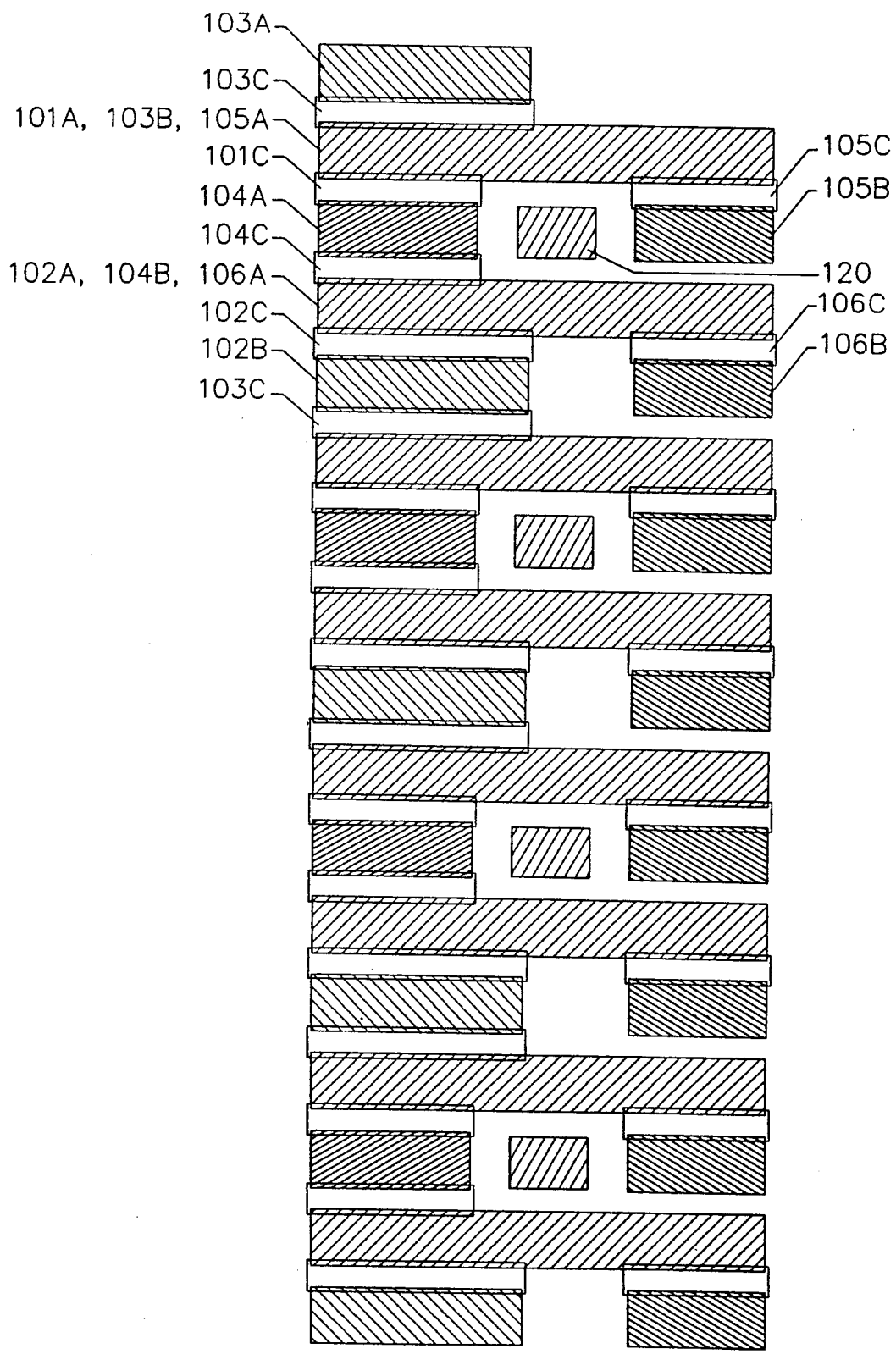
Figure 5F:
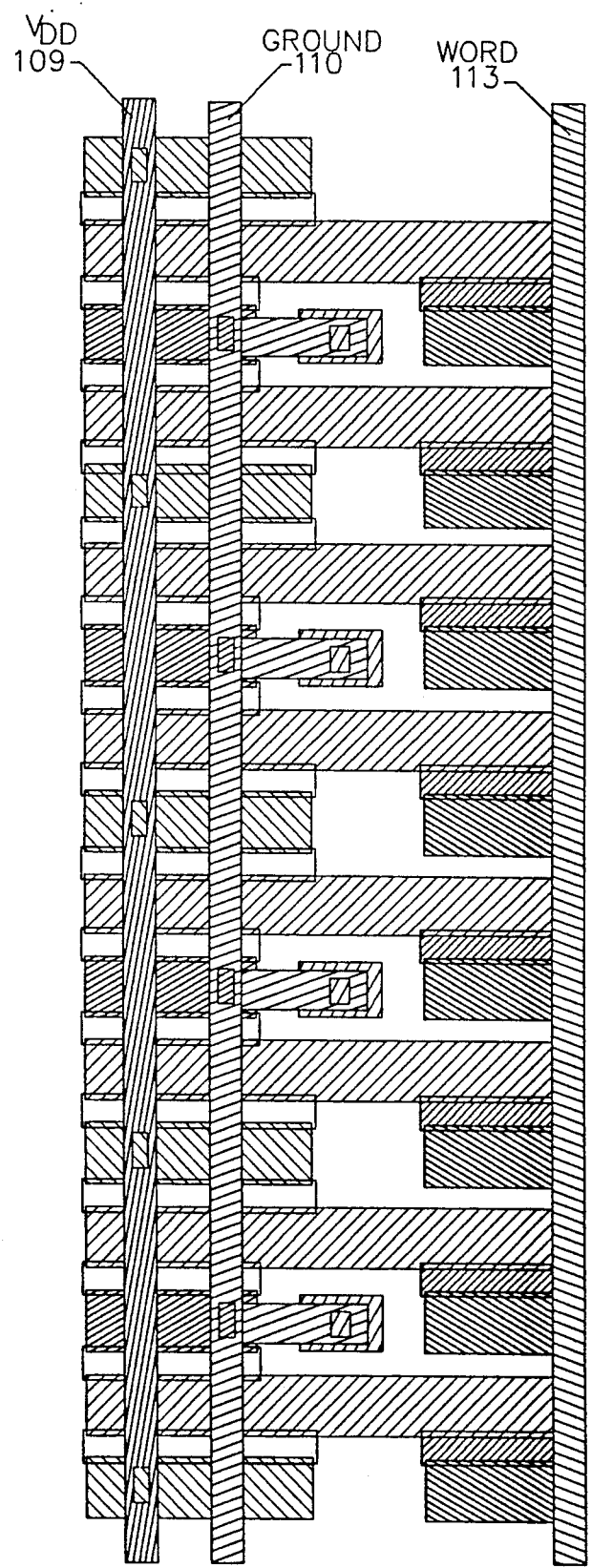
Figure 5G:
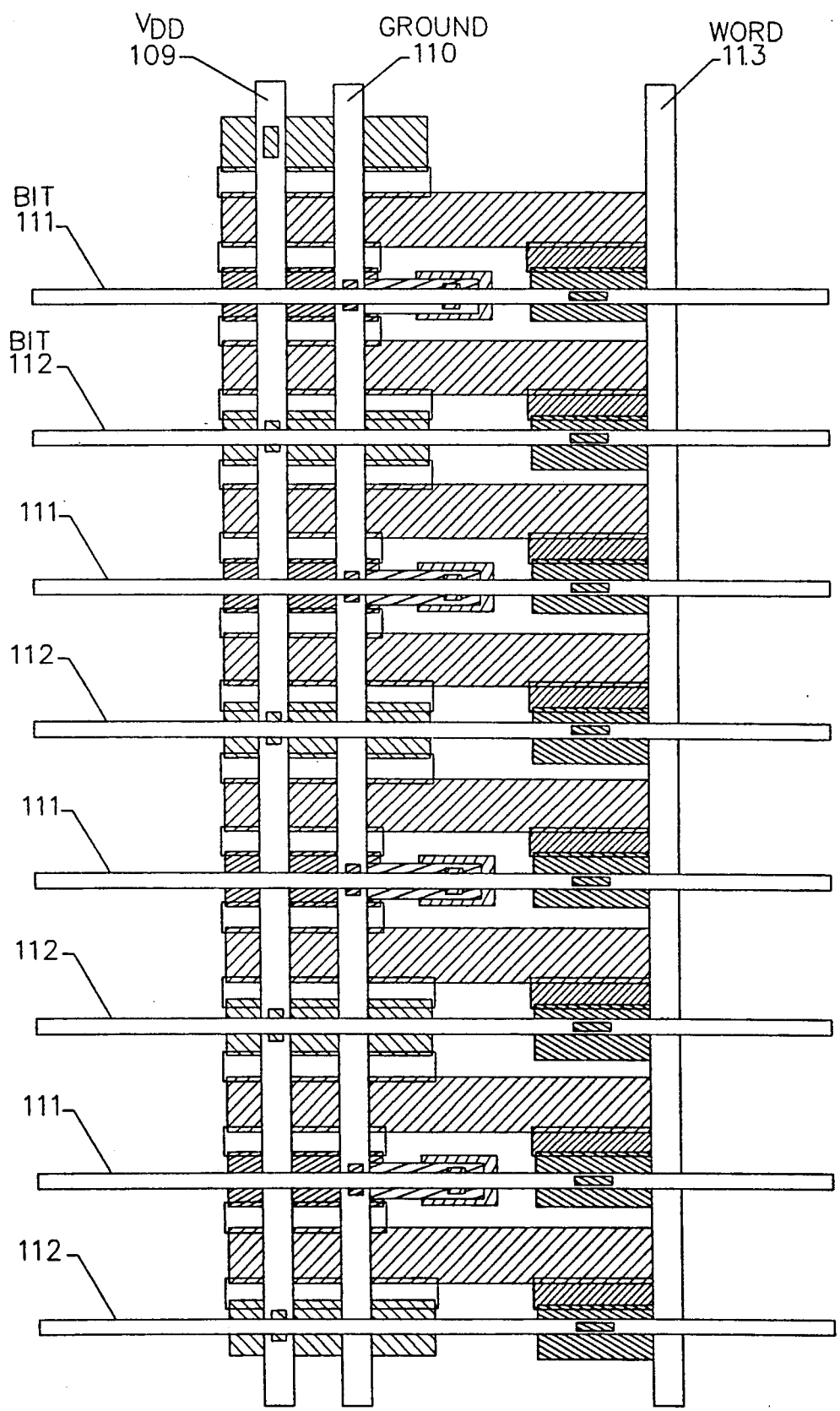

FIG. 5C illustrates how the left half and the right half of cell 100 are combined into a single compact structure, and FIG. 5D illustrates how this compact structure is replicated to form a column of SRAM cells. For ease of illustration, FIG. 5E illustrates the same column of cells of FIG. 5D, except the various regions are noted by cross hatching rather than reference numbers. FIG. 5F illustrates the manner in which the regions are connected to $V_{DD}$ 109, to ground 110 and to the word line 113. The connection of bit lines 111, 112 are shown in FIG. 5G. Accordingly, a high density array may be formed. For example, using 0.8 micron ground rules, the SRAM cell dimensions may be 7 microns by 11 microns.

FERMI-FET FOR LOW CAPACITANCE INPUT TRANSISTOR

In the design of the SRAM circuit of FIG. 2, it was found that the pass transistors 105, 106 are preferably Fermi-FET transistors because the input gate capacitance of the Fermi-FET is about one third the input capacitance of a conventional FET which includes an inversion layer. Accordingly, the Fermi-FET may be preferably used in any transistor circuit in which low input capacitance is required. For example, in logic circuits where an output typically must drive a large number of inputs, a low capacitance input is desired so that a single output can drive a large number of gate inputs. In other words, the "fan-out" of the logic gate is increased. Similar applications occur in many transistor circuits in which it is desired for the input of the circuit to have a minimal capacitive loading effect on the output of the circuits.

Figure 6:
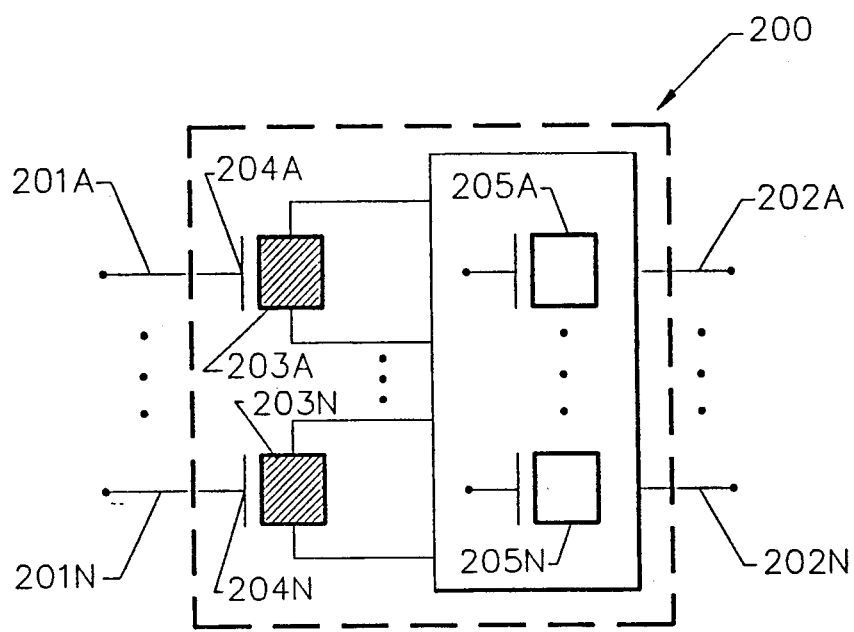
FIG. 6 illustrates the use of a Fermi-FET as low capacitance input transistor.

Referring now to FIG. 6, a transistor circuit using Fermi-FET input devices is shown. As shown in FIG. 6, transistor circuit 200 includes at least one input terminal 201A ... 201N and at least one output terminal 202A ... 202N. At least one Fermi-threshold field effect transistor 203A-203N is provided with its controlling electrode (gate) 204A ... 204N being electrically connected to an associated input terminal 201. A plurality of circuit transistors 205A ... 205N are electrically connected to the Fermi-FET input transistors 203 and to the output terminals 202. As shown, minimal capacitive loading of the input terminals are provided by using Fermi-FETs as the input transistors. It will be understood by those having skill in the art that the circuit transistors 205 may be conventional MOSFETs including an inversion layer or may be Fermi-FETs or a combination thereof.

FERMI-FET AS A TEMPERATURE COMPENSATING, CURRENT INDEPENDENT LOAD RESISTOR

As described in FIG. 2, Fermi-FETs 103 and 104 may be configured in source follower configuration to provide a load resistor having a high resistor value which is independent of the current therethrough. Moreover, when coupled with conventional FETs 101 and 102, temperature compensation is provided. The need for high valued current independent resistors Which can provide temperature compensation transcends the design of the SRAM and is applicable to other transistor circuits such as logic circuits. The use of the Fermi-FET as a load resistor in a transistor circuit is described in FIG. 7.

Figure 7:
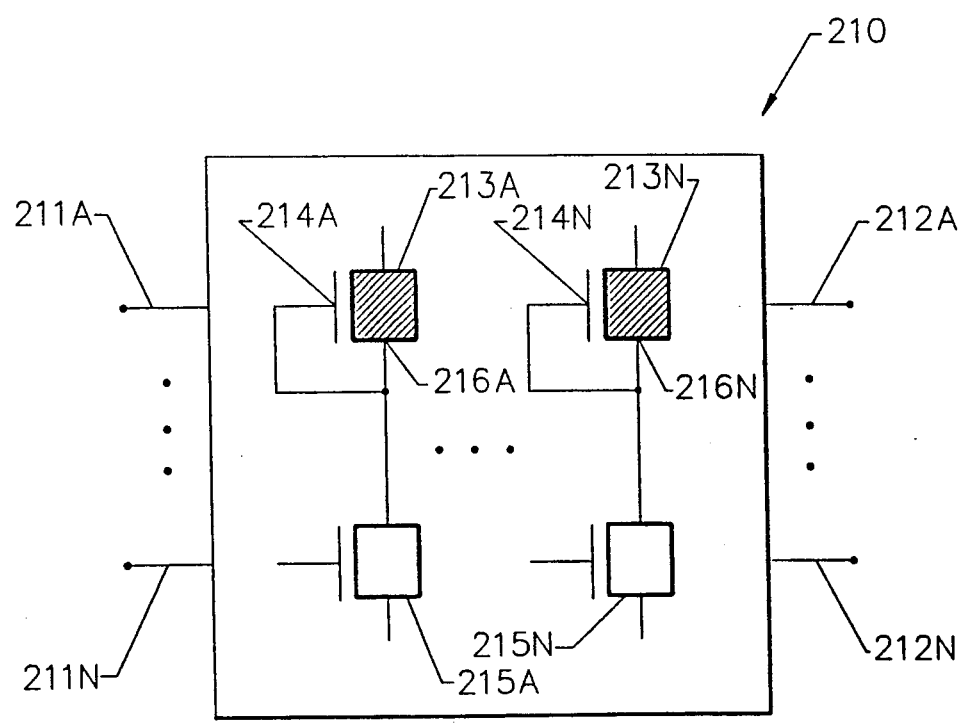
FIG. 7 illustrates the Fermi-FET as a current independent, temperature compensating load resistor.

As shown in FIG. 7, transistor circuit 210 includes at least one input terminal 211A ..211N and at least one output terminal 212A . . . 212N. At least one conventional MOSFET transistor 215A . . . 215N is shown connected to a Fermi-FET transistor 213A . . . 213N, with the Fermi-FET transistor 213 operating as a load resistor for the MOSFET. As illustrated, the Fermi-FET transistors are configured in source follower configuration with the gate 214A . . . 214N being connected to the source 216A . . . 216N. As already described the Fermi-FET operating as a source follower below threshold provides a high valued resistor the value of which is independent of the current therethrough. Moreover, temperature compensation is provided for the field effect transistors 215 so that the circuit can operate over wide temperature variations.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A static random access memory (SRAM) cell comprising:
    a pair of cross coupled field effect transistors; and
    a pair of Fermi-threshold field effect transistors, a respective one of which is electrically connected to a respective one of said cross coupled field effect transistors, for providing resistive loads for said cross coupled field effect transistors.

2. The SRAM cell of claim 1 wherein each of said pair of cross-coupled field effect transistors includes an inversion layer, and wherein each of said pair of Fermi-threshold field effect transistors is free of an inversion layer.

3. The SRAM cell of claim 1 wherein one of said pair of cross coupled field effect transistors and one of said pair of Fermi-threshold field effect transistors are electrically connected in series between a first and a second electrical potential, and wherein the other of said pair of cross coupled field effect transistors and the other of said pair of Fermi-threshold field effect transistors are electrically connected in series between said first and second electrical potentials.

4. The SRAM cell of claim 1 further comprising a pair of pass transistors, a respective one of which is electrically connected to a respective one of said pair of cross coupled field effect transistors, for storing a binary value in said pair of cross coupled field effect transistors.

5. The SRAM cell of claim 4 wherein said pair of pass transistors comprise a pair of Fermi-threshold field effect transistors.

6. The SRAM cell of claim 1 wherein said first and second Fermi-threshold field effect transistors are configured in source follower configuration.

7. The SRAM cell of claim 1 wherein each of said Fermi-threshold field effect transistors further comprises a germanium doped channel.

8. The SRAM cell of claim 1 wherein said pair of cross-coupled field effect transistors and said pair of Fermi-threshold field effect transistors ar of a first conductivity type.

9. The SRAM cell of claim 4 wherein said pair of cross-coupled field effect transistors, said pair of Fermi-threshold field effect transistors and said pair of pass transistors are of a first conductivity type.

10. The SRAM cell of claim 1 wherein said pair of cross-coupled field effect transistors comprise metal oxide semiconductor field effect transistors (MOSFET).

11. A static random access memory (SRAM) cell comprising:
    a first and a second field effect transistor, each of which includes a first and a second controlled electrode and a controlling electrode, each of which further includes an inversion layer between said first and second controlled electrodes, said controlling electrode of said first transistor being electrically connected to said first controlled electrode of said second transistor, and said controlling electrode of said second transistor being electrically connected to said first controlled electrode of said first transistor to produce a cross coupled transistor pair;
    a first and a second Fermi-threshold transistor, each of which includes a first and a second controlled electrode and a controlling electrode, and each of which is free of an inversion layer between said first and second controlled electrodes, said controlling electrode and said second controlled electrode of said first Fermi-threshold transistor being electrically connected to said first controlled electrode of said first field effect transistor, and said controlling electrode and said second controlled electrode of said second Fermi-threshold transistor being electrically connected to said first controlled electrode of said second field effect transistor to provide first and second resistive loads for said first and second field effect transistors, respectively, said first controlled electrode of said first and said second Fermi-threshold transistors being electrically connected to a first electrical potential source, and said second controlled electrode of said first and second field effect transistors being electrically connected to a second potential source.

12. The SRAM cell of claim 11 further comprising:
    a word line;
    a first and a second bit line;
    a first and a second pass transistor, each of which includes a first and a second controlled electrode and a controlling electrode, the controlling electrodes of each of said pass transistors being electrically connected to said word line, for enabling selection of said SRAM cell for storing data, said first and said second controlled electrodes of said first pass transistor being electrically connected between said first bit line and said first controlled electrode of said first field effect transistor, and said first and said second controlled electrodes of said second pass transistor being electrically connected between said second bit line and said first controlled electrode of said second field effect transistor to enable storing of data in said memory cell.

13. The SRAM cell of claim 12 wherein said first and said second pass transistors comprise third and fourth Fermi-threshold transistors respectively.

14. The SRAM cell of claim 11 wherein each of said first and second Fermi-threshold transistors further comprises a germanium doped channel.

15. The SRAM cell of claim 11 wherein said first and second field effect transistor and said first and second Fermi-threshold transistors are of a first conductivity type.

16. The SRAM cell of claim 12 wherein said first and second field effect transistor, said first and second Fermi-threshold transistors and said first and second pass transistors are of a first conductivity type.

17. The SRAM cell of claim 11 wherein said first and second field effect transistors comprises metal oxide semiconductor field effect transistors (MOSFET).

* * * * *